(12) United States Patent
Magi et al.

(10) Patent No.: US 9,665,132 B2
(45) Date of Patent: May 30, 2017

(54) UNITARY CHASSIS FOR ELECTRONIC DEVICE

(71) Applicant: Intel Corporation, Santa Clara, CA (US)

(72) Inventors: Aleksander Magi, Aloha, OR (US);
Mark E. Sprenger, Folsom, CA (US);
Paul J. Gwin, Orangevale, CA (US)

(73) Assignee: Intel Corporation

( * ) Notice: Subject to any disclaimer, the term of this patent is extended or adjusted under 35 U.S.C. 154(b) by 0 days.

(21) Appl. No.: 14/751,593

(22) Filed: Jun. 26, 2015

(65) Prior Publication Data

US 2016/0378136 A1 Dec. 29, 2016

(51) Int. Cl.
*G06F 1/16* (2006.01)
*H05K 5/00* (2006.01)
*H05K 5/02* (2006.01)

(52) U.S. Cl.
CPC ............ *G06F 1/169* (2013.01); *G06F 1/1662* (2013.01); *H05K 5/0004* (2013.01); *H05K 5/0247* (2013.01)

(58) Field of Classification Search
CPC ...................................... G06F 1/169
USPC ...................................... 361/679.55
See application file for complete search history.

(56) References Cited

U.S. PATENT DOCUMENTS

| | | | | |
|---|---|---|---|---|
| 5,576,929 | A * | 11/1996 | Uchiyama | A45C 13/1076 190/109 |
| 7,930,011 | B2 * | 4/2011 | Shi | H05K 5/0243 206/320 |
| 8,995,125 | B2 * | 3/2015 | Matsuoka | G06F 1/1658 361/679.55 |
| 2001/0015005 | A1 * | 8/2001 | Chung | B23P 15/00 29/458 |
| 2002/0006031 | A1 * | 1/2002 | Liu | G06F 1/1616 361/756 |
| 2003/0011986 | A1 * | 1/2003 | Ariga | G06F 1/1616 361/679.49 |
| 2003/0021082 | A1 * | 1/2003 | Lu | G06F 1/1616 361/679.4 |
| 2006/0268502 | A1 * | 11/2006 | Liu | G06F 1/1656 361/679.55 |
| 2010/0091442 | A1 * | 4/2010 | Theobald | G06F 1/1616 361/679.09 |
| 2010/0092022 | A1 * | 4/2010 | Hopkinson | H04R 1/023 381/391 |
| 2011/0043971 | A1 | 2/2011 | Jorgensen et al. | |

(Continued)

FOREIGN PATENT DOCUMENTS

KR 10-1343724 B1 12/2013
WO 2015-016855 A1 2/2015

OTHER PUBLICATIONS

International Search Report and Written Opinion received for International Application No. PCT/US2016/034348, mailed on Sep. 12, 2016, 11 pages.

*Primary Examiner* — Adrian S Wilson
(74) *Attorney, Agent, or Firm* — Alpine Technology Law Group LLC

(57) ABSTRACT

In one example an electronic device comprises at least one electronic component and a chassis comprising a unitary body comprising a first major surface and a second major surface, a first wall and a second wall defining a chamber having a first opening to receive an electronic component. Other examples may be described.

16 Claims, 11 Drawing Sheets

(56) References Cited

U.S. PATENT DOCUMENTS

| | | | |
|---|---|---|---|
| 2012/0099264 A1* | 4/2012 | Degner | G06F 1/1616 361/679.09 |
| 2014/0016257 A1* | 1/2014 | Matsuoka | H05K 5/03 361/679.26 |
| 2014/0043744 A1 | 2/2014 | Matsuoka et al. | |
| 2014/0254078 A1 | 9/2014 | Matsuoka | |

* cited by examiner

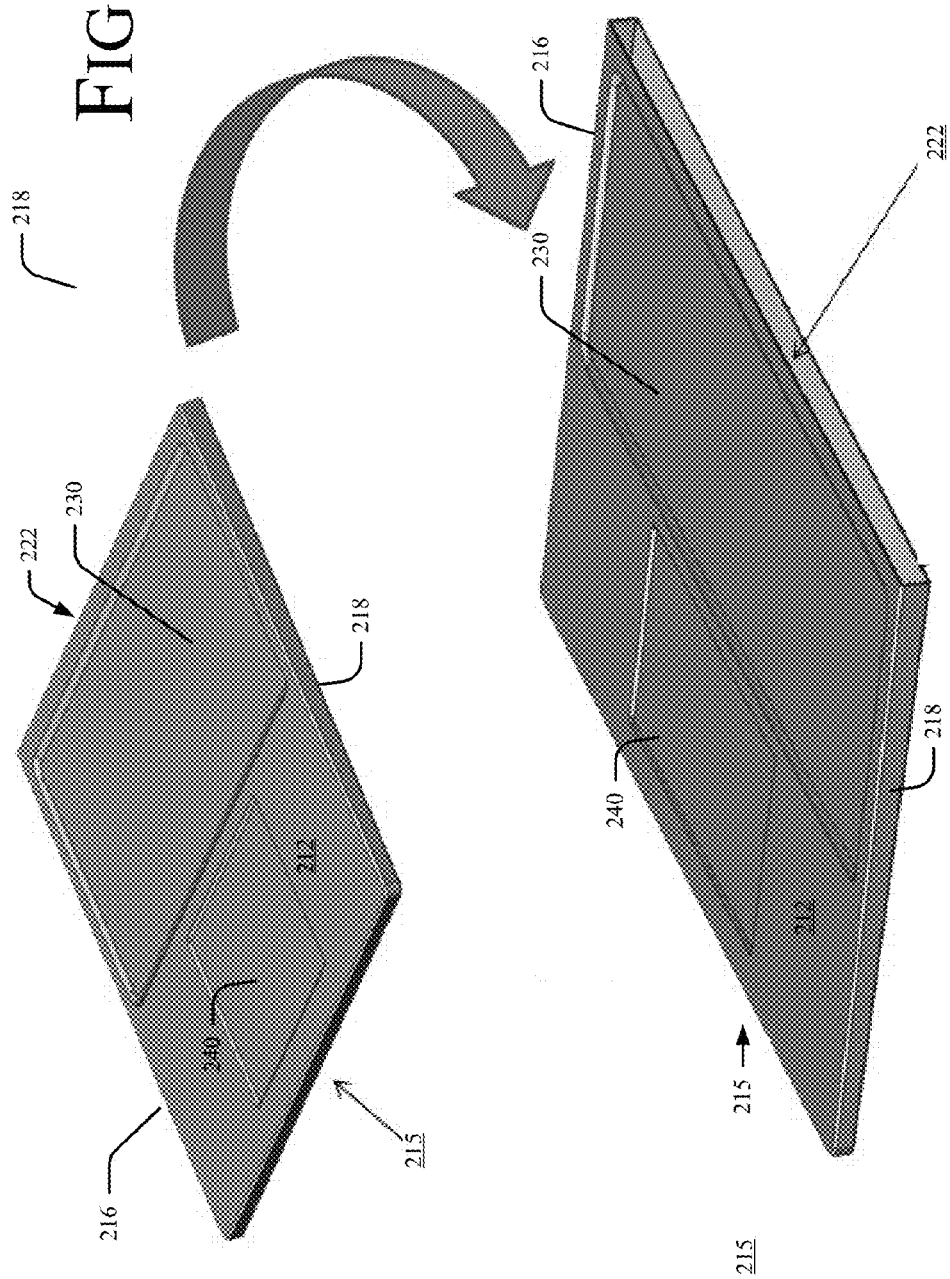

UNITARY CHASSIS FOR ELECTRONIC DEVICE

BACKGROUND

The subject matter described herein relates generally to the field of electronic devices and more particularly to a unitary chassis for electronic devices.

Electronic devices such as laptop computers, notebook computers, tablet devices, mobile phones, electronic readers, and the like are generating a need for high-quality chassis designs that allow for complex geometric features. Existing techniques for manufacturing chassis components for electronic devices are reaching practical limits in obtaining such features. Accordingly additional techniques to manufacture electronic device chassis components may find utility.

BRIEF DESCRIPTION OF THE DRAWINGS

The detailed description is described with reference to the accompanying figures.

FIG. 4 is a schematic illustration of a unitary chassis for an electronic device in accordance with some examples.

DETAILED DESCRIPTION

Described herein are exemplary systems and methods to manufacture a unitary chassis for electronic devices. In the following description, numerous specific details are set forth to provide a thorough understanding of various examples. However, it will be understood by those skilled in the art that the various examples may be practiced without the specific details. In other instances, well-known methods, procedures, components, and circuits have not been illustrated or described in detail so as not to obscure the particular examples.

As described above, it may be useful to provide a unitary chassis for electronic devices. In some examples, the subject matter described herein addresses these and other issues by providing a chassis for an electronic device comprising a unitary body comprising a first major surface and a second major surface, a first wall and a second wall defining a chamber having a first opening to receive an electronic component. Further structural and operational details will be described with reference to FIGS. 1-10, below.

Figure 1:
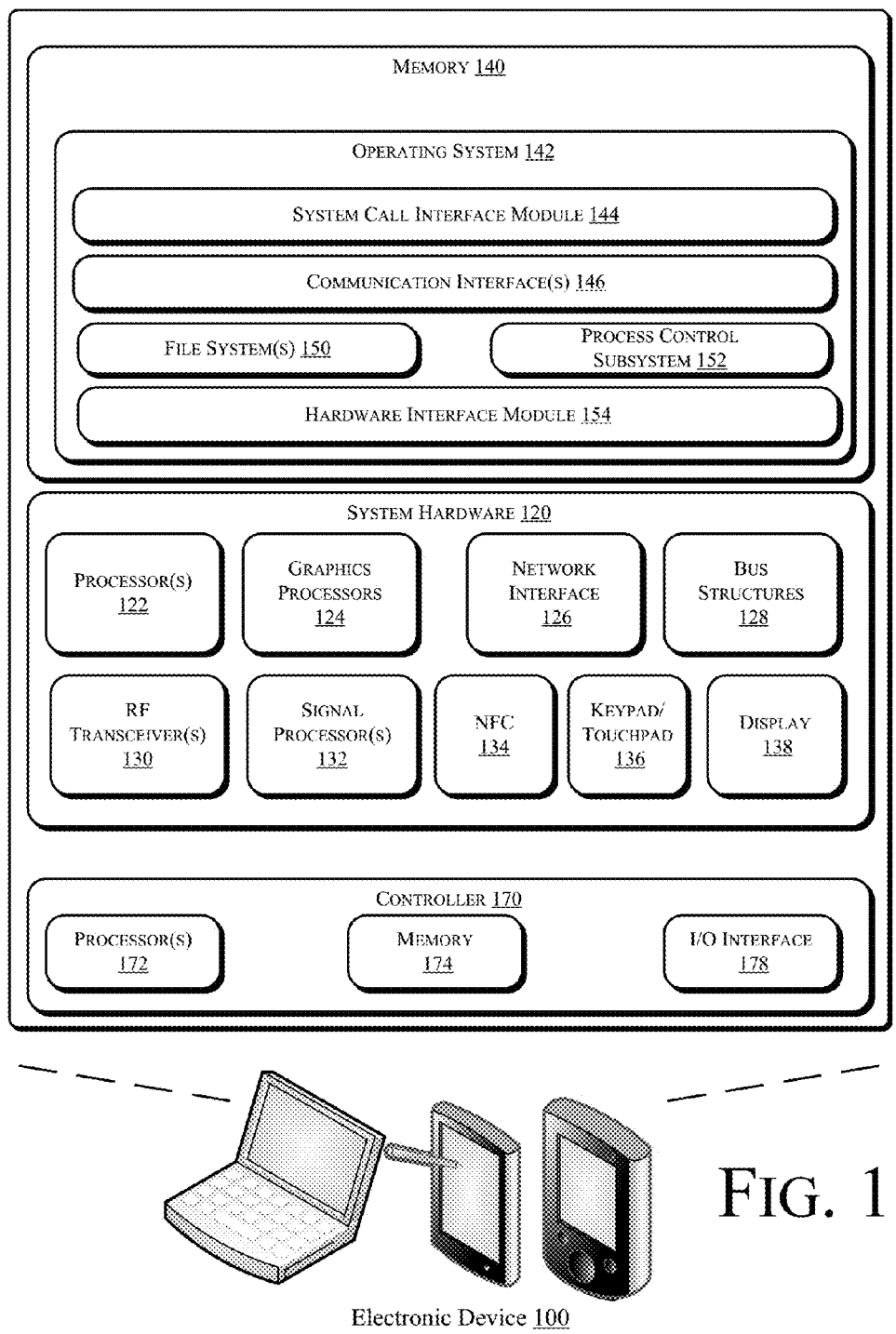
FIG. 1 is a schematic illustration of an electronic device which may be include a unitary chassis in accordance with some examples.

FIG. 1 is a schematic illustration of an electronic device 100 which may be adapted to implement an unitary chassis 164 in accordance with some examples. In various examples, electronic device 100 may include or be coupled to one or more accompanying input/output devices including a display, one or more speakers, a keyboard, one or more other I/O device(s), a mouse, a camera, or the like. Other exemplary I/O device(s) may include a touch screen, a voice-activated input device, a track ball, a geolocation device, an accelerometer/gyroscope, biometric feature input devices, and any other device that allows the electronic device 100 to receive input from a user.

The electronic device 100 includes system hardware 120 and memory 140, which may be implemented as random access memory and/or read-only memory. A file store may be communicatively coupled to electronic device 100. The file store may be internal to electronic device 100 such as, e.g., eMMC, SSD, one or more hard drives, or other types of storage devices. Alternatively, the file store may also be external to electronic device 100 such as, e.g., one or more external hard drives, network attached storage, or a separate storage network.

System hardware 120 may include one or more processors 122, graphics processors 124, network interfaces 126, and bus structures 128. In one example, processor 122 may be embodied as an Intel® Atom™ processors, Intel® Atom™ based System-on-a-Chip (SOC) or Intel® Core2 Duo® or i3/i5/i7 series processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 124 may function as adjunct processor that manages graphics and/or video operations. Graphics processor(s) 124 may be integrated onto the motherboard of electronic device 100 or may be coupled via an expansion slot on the motherboard or may be located on the same die or same package as the Processing Unit.

In one example, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 128 connect various components of system hardware 128. In one example, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI), a High Speed Synchronous Serial Interface (HSI), a Serial Low-power Inter-chip Media Bus (SLIMbus®), or the like.

Electronic device 100 may include an RF transceiver 130 to transceive RF signals, a Near Field Communication (NFC) radio 134, and a signal processing module 132 to process signals received by RF transceiver 130. RF transceiver may implement a local wireless connection via a protocol such as, e.g., Bluetooth or 802.11X. IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a WCDMA, LTE, general packet radio service (GPRS) interface (see, e.g., Guidelines on GPRS Handset Requirements, Global System for Mobile Communications/GSM Association, Ver. 3.0.1, December 2002).

Electronic device 100 may further include one or more input/output interfaces such as, e.g., a keypad 136 and a display 138. In some examples electronic device 100 may not have a keypad and use the touch panel for input.

Memory 140 may include an operating system 142 for managing operations of electronic device 100. In one example, operating system 142 includes a hardware interface module 154 that provides an interface to system hardware 120. In addition, operating system 140 may include a file system 150 that manages files used in the operation of electronic device 100 and a process control subsystem 152 that manages processes executing on electronic device 100.

Operating system 142 may include (or manage) one or more communication interfaces 146 that may operate in conjunction with system hardware 120 to transceive data packets and/or data streams from a remote source. Operating system 142 may further include a system call interface module 144 that provides an interface between the operating system 142 and one or more application modules resident in memory 130. Operating system 142 may be embodied as a UNIX operating system or any derivative thereof (e.g., Linux, Android, etc.) or as a Windows® brand operating system, or other operating systems.

In some examples an electronic device may include a controller 170, which may comprise one or more controllers that are separate from the primary execution environment. The separation may be physical in the sense that the controller may be implemented in controllers which are physically separate from the main processors. Alternatively, the trusted execution environment may logical in the sense that the controller may be hosted on same chip or chipset that hosts the main processors.

By way of example, in some examples the controller 170 may be implemented as an independent integrated circuit located on the motherboard of the electronic device 100, e.g., as a dedicated processor block on the same SOC die. In other examples the trusted execution engine may be implemented on a portion of the processor(s) 122 that is segregated from the rest of the processor(s) using hardware enforced mechanisms In the example depicted in FIG. 1 the controller 170 comprises a processor 172, a memory module 174, and an I/O interface 178. In some examples the memory module 174 may comprise a persistent flash memory module and the various functional modules may be implemented as logic instructions encoded in the persistent memory module, e.g., firmware or software. The I/O module 178 may comprise a serial I/O module or a parallel I/O module. Because the controller 170 is separate from the main processor(s) 122 and operating system 142, the controller 170 may be made secure, i.e., inaccessible to hackers who typically mount software attacks from the host processor 122.

Figure 2A:
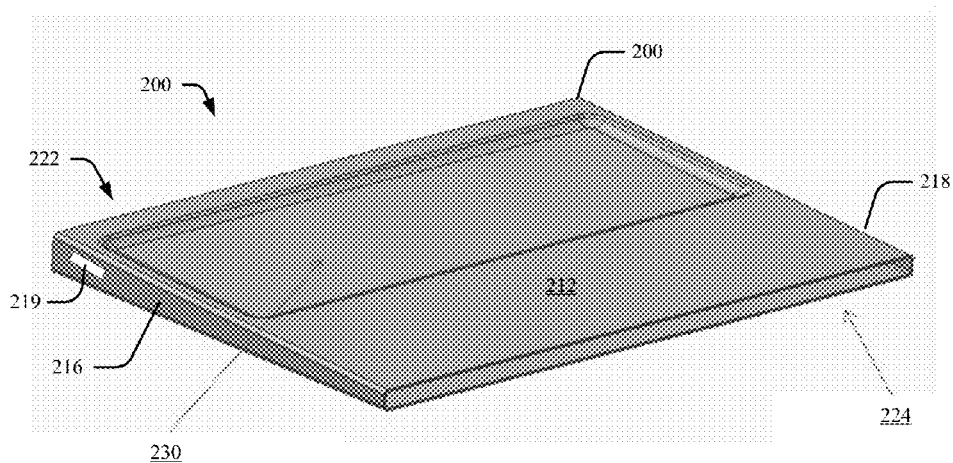
FIGS. 2A-2E are schematic illustrations of a a unitary chassis for an electronic device in accordance with some examples.
Figure 2B:
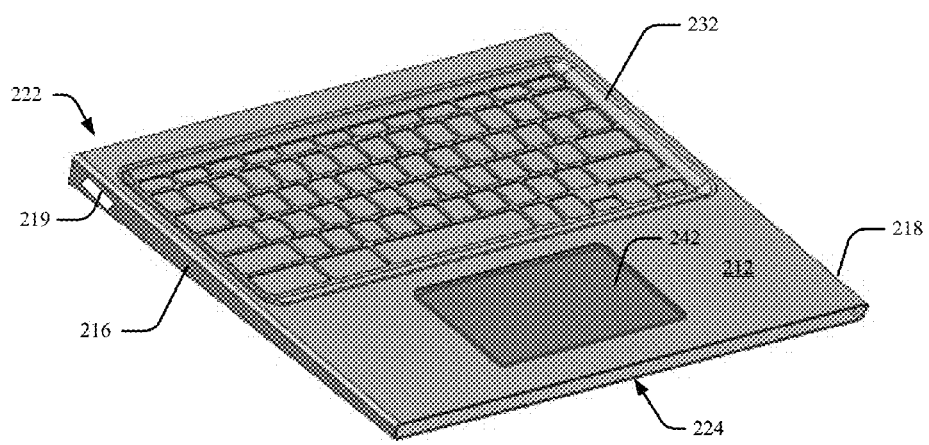

FIGS. 2A-2E are schematic illustrations of a unitary chassis for an electronic device in accordance with some examples. Referring to FIGS. 2A-2B, in some examples a chassis 200 for an electronic device 100 comprises a unitary body 210 having a first major surface 212 and a second major surface 214, a first wall 216 and a second wall 218 defining a chamber 220 having a first opening 222 to receive an electronic component 270.

In some examples the first major surface 212 of the chassis 200 comprises a keyboard emboss 230 dimensioned to receive a keyboard tray 232. In further embodiments the first major surface 212 comprises a trackpad emboss 240 (FIG. 2C) dimensioned to receive a trackpad cover 242.

Figure 2C:
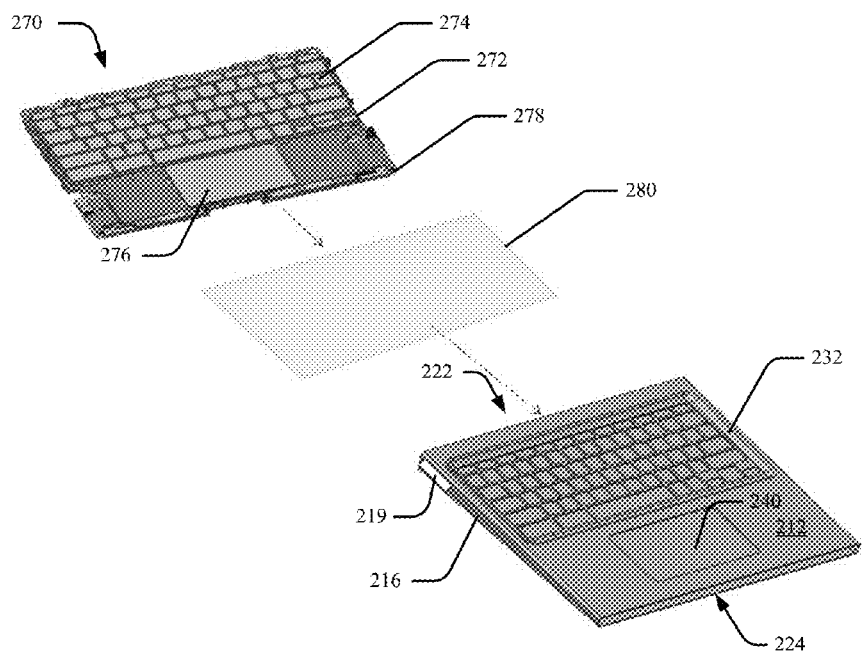
Figure 2D:
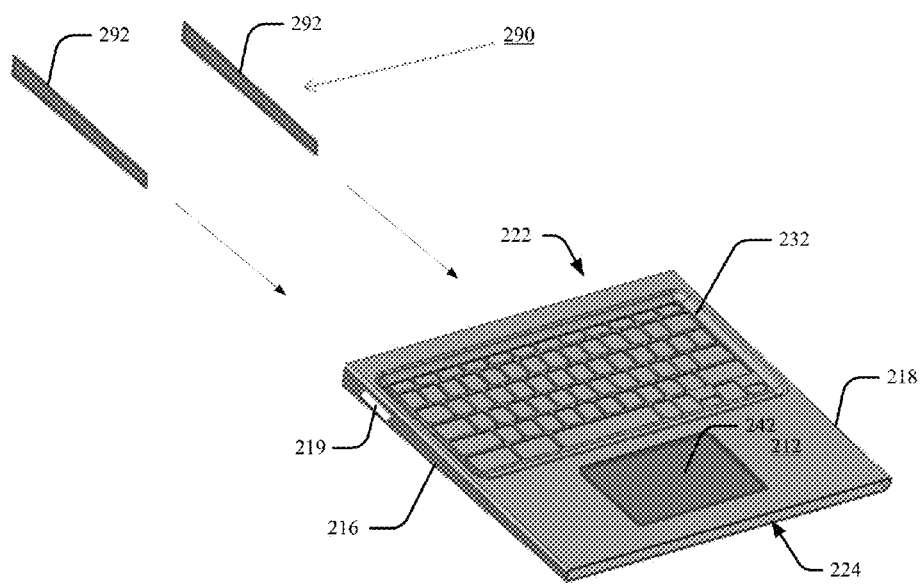
Figure 2E:
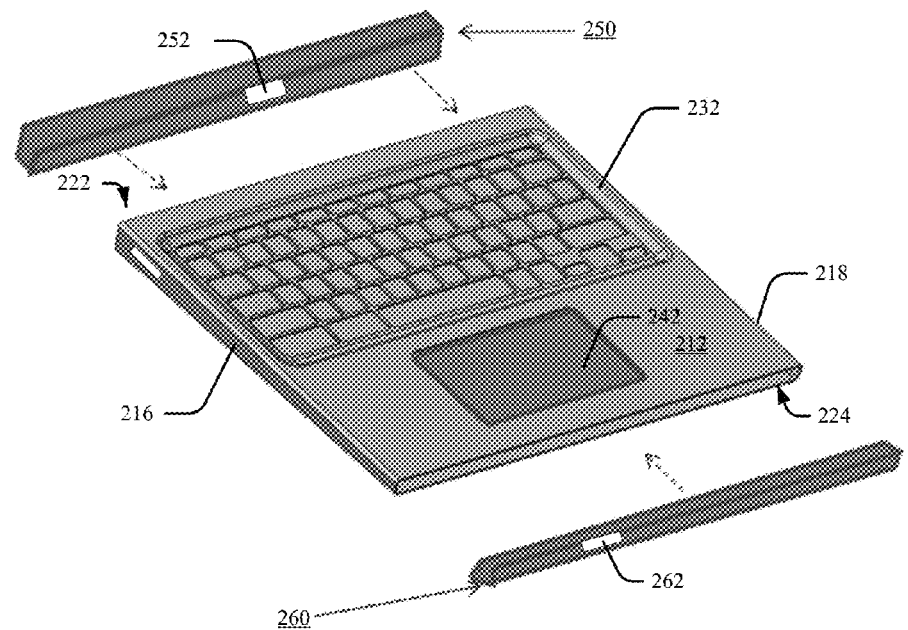

As illustrated in FIG. 2E, in some examples the chassis 200 may include a first end cap 250 dimensioned to fit over the first opening 222 of the chamber 220 and a second end cap 260 dimensioned to fit over a second opening 224 of the chamber 220. The first end cap 250 may comprise an input/output (I/O) port 252 to be coupled to the electronic component 270 and the second end cap 260 comprises an input/output (I/O) port 262 to be coupled to the electronic component. In some examples, at least one of the first wall 216 or the second wall 218 comprises an input/output (I/O) port 219 to be coupled to the electronic component 270.

In some examples the unitary body 210 may be formed from a ductile metal (e.g., aluminum, steel, or the like) by a hydroforming process in which the unitary body is placed into a mold defining one or more negative volumes and sealed and the chamber is pressurized to expand the unitary body 210. One example of a method will be described with reference to FIG. 5A.

At operation 510 a blank is placed into a mold. In some examples the blank may be formed in a rough shape that corresponds to the chassis. The mold may define one or more negative volumes in the surfaces of chassis 200. For example, the mold may define the keyboard emboss 230 and the trackpad emboss 240.

At operation 515 the end openings 222, 224 of the blank may be capped, and at operation 520 the blank is filled with pressurized fluid, which causes the blank to expand within the mold such that the surfaces of the blank conform to the surfaces of the mold. In some examples the pressure of the chamber 220 may be raised to a range between 5000 pounds per square inch (PSI) and 15000 PSI.

When the molding operation is complete the formed chassis 200 may be removed from the mold (operation 520) and portions of the chassis 200 may be removed by a machining process. For example, a portion of the keyboard emboss 230 and a portion of the trackpad emboss 240 may be removed by a machining process. Further a machining process may be used to define one or more I/O ports 219 on the surfaces of chassis 200.

Figure 5A:
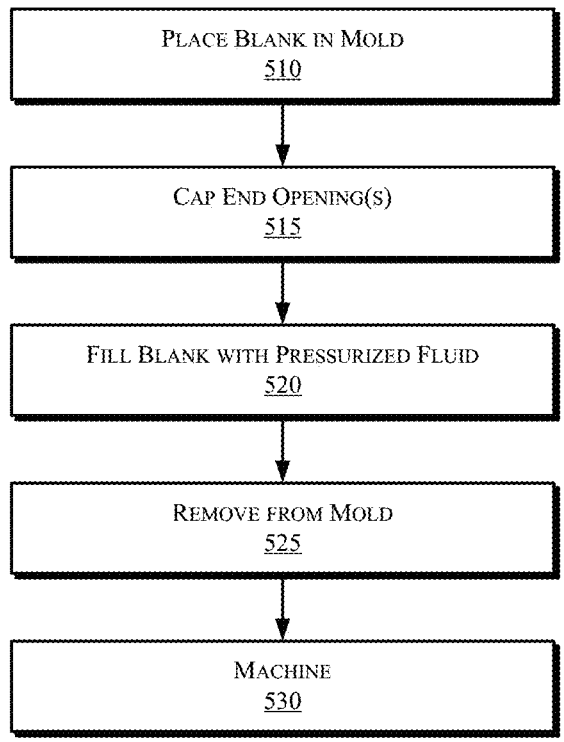
FIGS. 5A-5B are flowcharts illustrating operations in a method to make a unitary chassis for an electronic device in accordance with some examples.
Figure 5B:
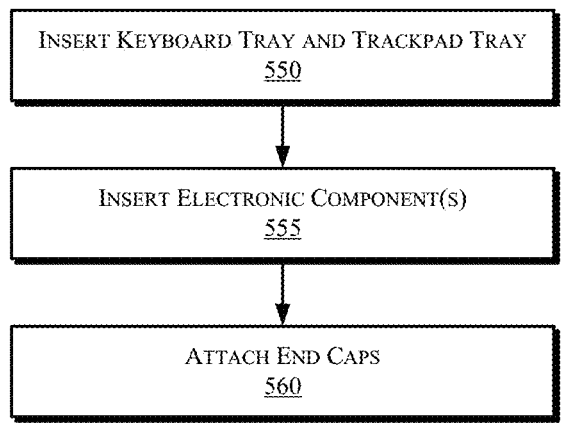

One example of a method to assemble an electronic device 100 using a chassis 200 will be described with reference to FIG. 5B. At operation 550 a keyboard tray 232 may be inserted into the keyboard emboss 230 and a trackpad cover 242 may be inserted into the trackpad emboss 240. The keyboard tray 232 and trackpad cover 242 may be secured using conventional fasteners, e.g., screws, adhesives, or snap-fittings.

At operation 555 one or more electronic components 270 may be inserted into the chamber 220 of the chassis. Referring to FIG. 2C, in some examples the electronic components 270 may comprise a motherboard 272, a keyboard 274, and a trackpad 276 mounted on a frame 278. The electronic components 270 may be inserted into the chamber 220 through the first opening 222 as indicated in FIG. 2C. In some examples a thin polymer film 280 may be used to facilitate sliding the electronic components into the chamber 220. For example, the thin polymer film 270 may be positioned on top of the electronic components 270 while the electronic components 270 are slid into the chamber and removed once the electronic components 270 have been positioned in the chamber 220.

Referring to FIG. 2D, in some examples the electronic components 270 may be held in place using one or more jacking flanges 290 which may be inserted into the chamber. Jacking flanges 290 comprise an inclined surface 292 which, when inserted into the chamber 220, urges the electronic components 270 toward the first surface 212 such that the keyboard 274 is urged into the keyboard tray 232 and the trackpad 276 is urged into position under the trackpad cover 242.

At operation 560 the end caps are attached to the chassis. Referring to FIG. 2E, in some examples first end cap 250 may be secured to the first opening 222 of the chamber 220 and the second end cap 260 may be secured to the second opening 224 of the chamber. The respective end caps 250, 260 may be secured using conventional fasteners, e.g., screws, adhesives, or snap-fittings. In some examples a hinge assembly may be coupled to the first end cap 250 to couple a display to the chassis 200.

Figure 3:
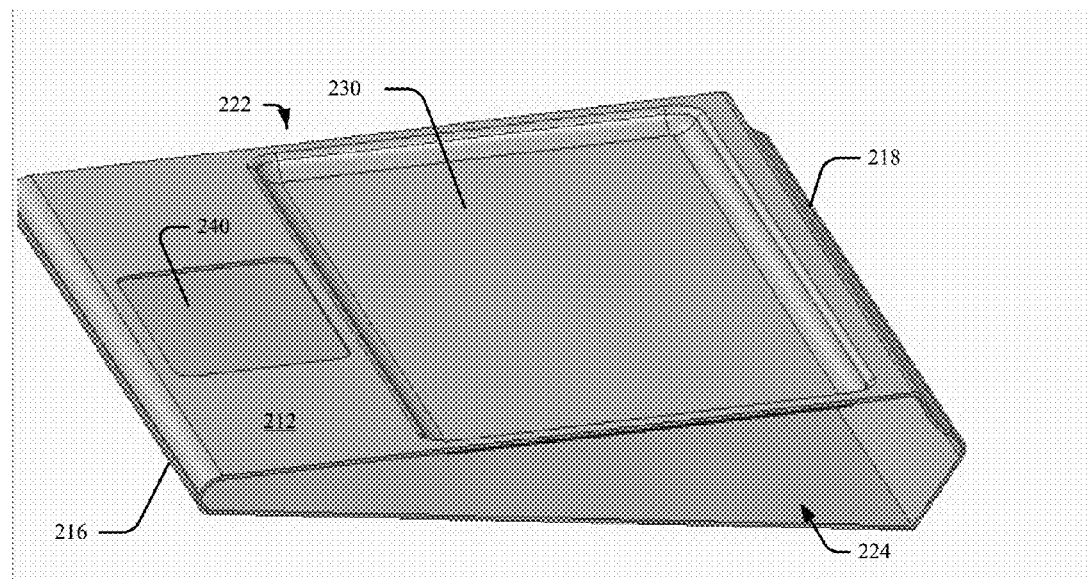
FIG. 3 is a schematic illustration of a unitary chassis for an electronic device in accordance with some examples.

FIG. 3 is a schematic illustration of a unitary chassis 200 for an electronic device in accordance with some examples. Many of the features of the chassis 200 depicted in FIG. 3 are the same as the features depicted in FIGS. 2A-2E and in the interest of clarity will not be repeated. In relevant part, the first opening 222 and second opening 224 of the chamber 200 are located on the sides of the chassis, rather than the front and back of the chassis.

FIG. 4 is a schematic illustration of a unitary chassis 200 for an electronic device in accordance with some examples. Many of the features of the chassis 200 depicted in FIG. 3 are the same as the features depicted in FIGS. 2A-2E and in the interest of clarity will not be repeated. In relevant part, chassis 200 depicted in FIG. 4 includes three walls 215, 216, 218 and a single opening 222.

Thus, the structures and operations depicted herein provide a unitary chassis for an electronic device.

Figure 6:
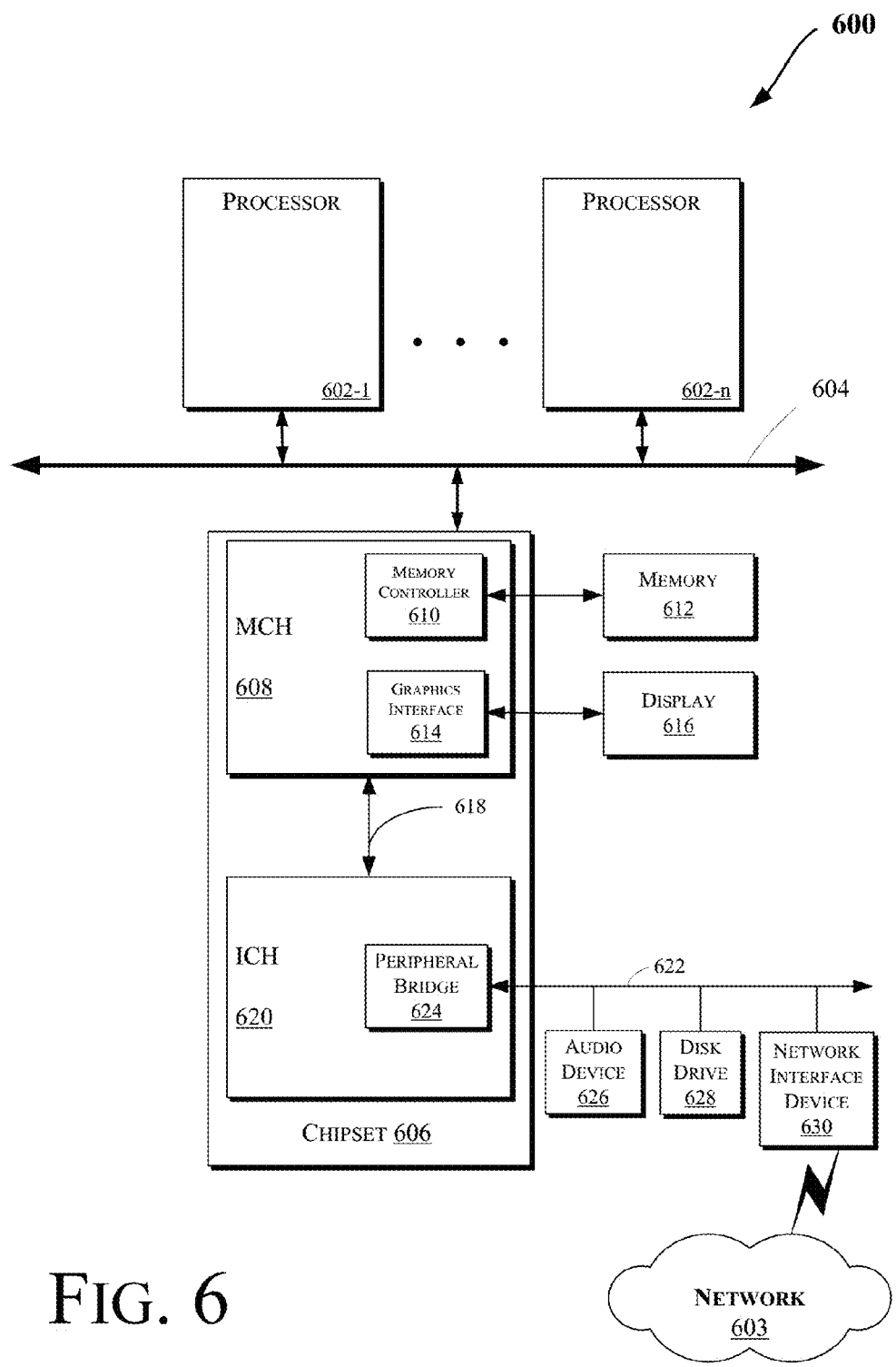
FIGS. 6-10 are schematic illustrations of electronic devices which may be adapted to implement a unitary chassis in accordance with some examples.

As described above, in some examples the electronic device may be embodied as a computer system. FIG. 6 illustrates a block diagram of a computing system 600 in accordance with an example. The computing system 600 may include one or more central processing unit(s) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an example, one or more of the processors 602 may be the same or similar to the processors 102 of FIG. 1. For example, one or more of the processors 602 may include the control unit 120 discussed with reference to FIGS. 1-3. Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the processor 602, or any other device included in the computing system 600. In one example, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple processor(s) and/or multiple system memories.

The MCH 608 may also include a graphics interface 614 that communicates with a display device 616. In one example, the graphics interface 614 may communicate with the display device 616 via an accelerated graphics port (AGP). In an example, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the processor 602 and peripheral devices. Other types of topologies may be utilized. Also, multiple buses may communicate with the ICH 620, e.g., through multiple bridges or controllers. Moreover, other peripherals in communication with the ICH 620 may include, in various examples, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some examples. In addition, the processor 602 and one or more other components discussed herein may be combined to form a single chip (e.g., to provide a System on Chip (SOC)). Furthermore, the graphics accelerator 616 may be included within the MCH 608 in other examples.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
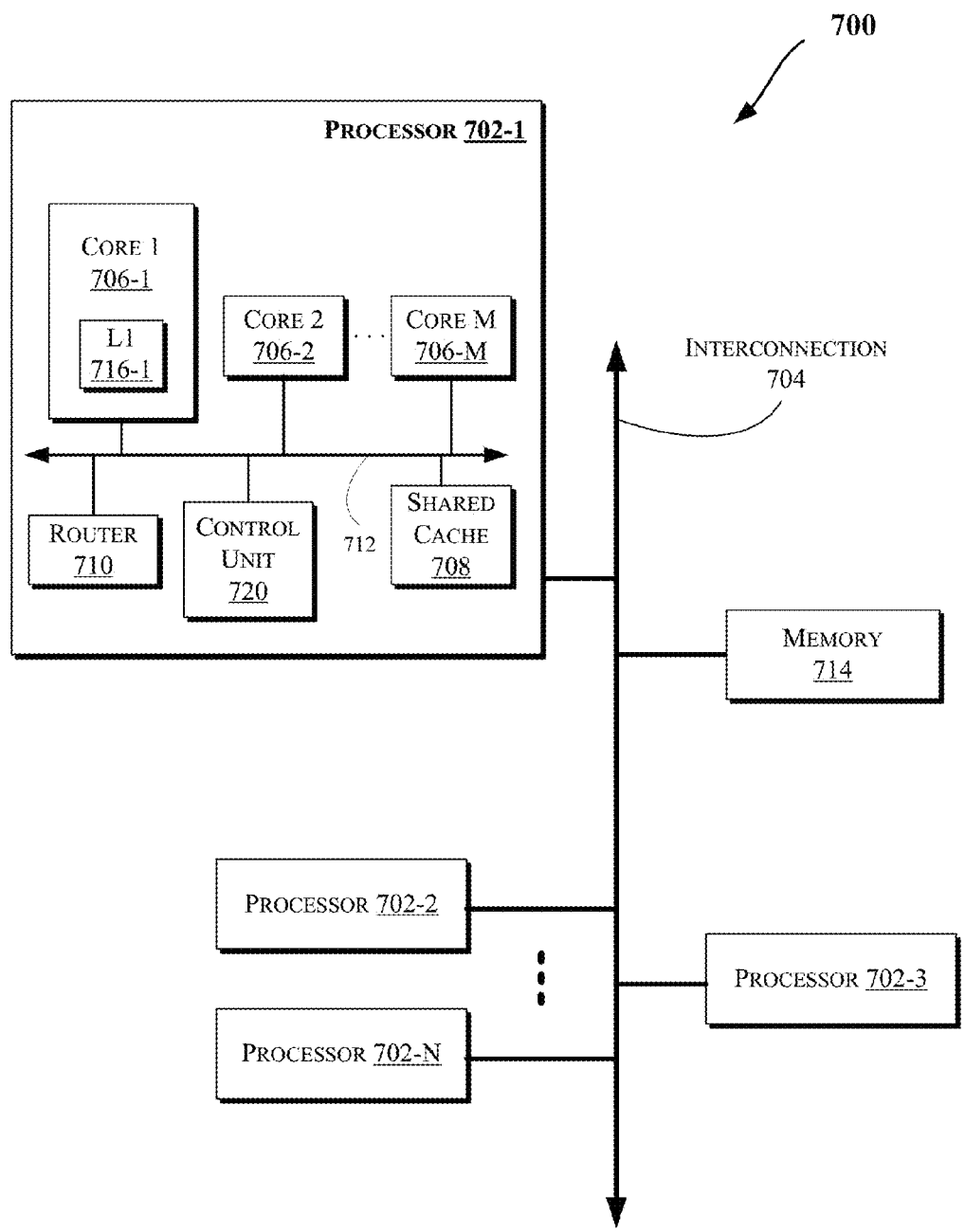

FIG. 7 illustrates a block diagram of a computing system 700, according to an example. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an example, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one example, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an example, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some examples, one or more of the cores 706 may include a level 1 (L1) cache 716-1 (generally referred to herein as "L1 cache 716").

Figure 8:
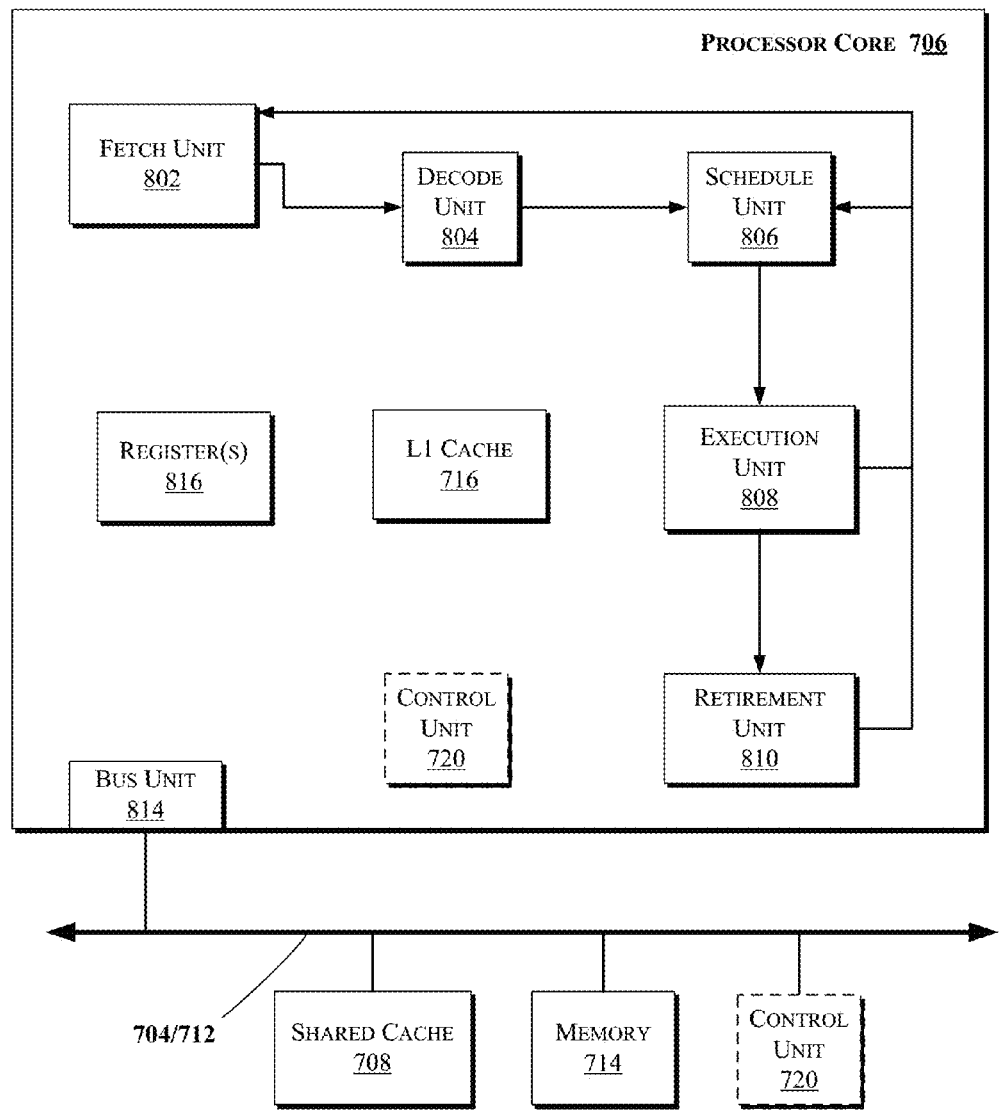

FIG. 8 illustrates a block diagram of portions of a processor core 706 and other components of a computing system, according to an example. In one example, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one example, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an example, the execution unit 808 may include more than one execution unit. The execution unit 808 may also perform various arithmetic operations such as addition, subtraction, multiplication, and/or division, and may include one or more an arithmetic logic units (ALUs). In an example, a co-processor (not shown) may perform various arithmetic operations in conjunction with the execution unit 808.

Further, the execution unit 808 may execute instructions out-of-order. Hence, the processor core 706 may be an out-of-order processor core in one example. The core 706 may also include a retirement unit 810. The retirement unit 810 may retire executed instructions after they are committed. In an example, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various examples the control unit 720 may be located elsewhere such as inside the core 706, coupled to the core via bus 704, etc.

Figure 9:
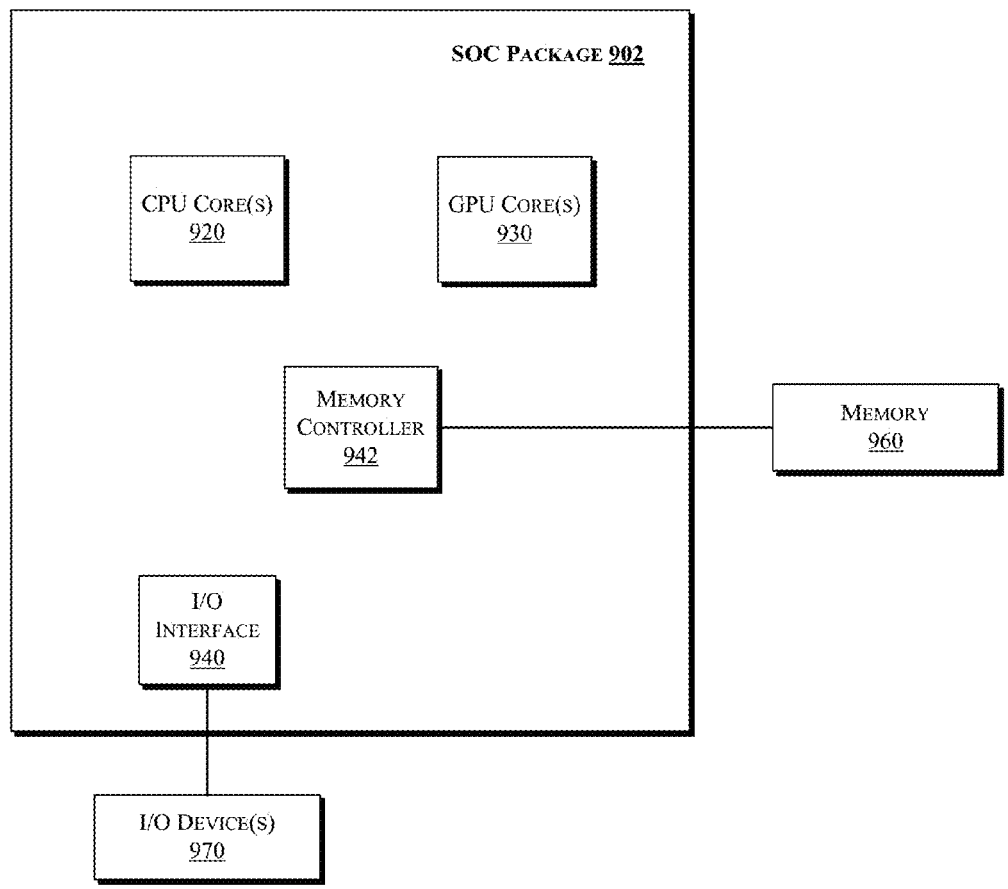

In some examples, one or more of the components discussed herein can be embodied as a System On Chip (SOC) device. FIG. 9 illustrates a block diagram of an SOC package in accordance with an example. As illustrated in FIG. 9, SOC 902 includes one or more processor cores 920, one or more graphics processor cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one example, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an example, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch surface, a speaker, or the like.

Figure 10:
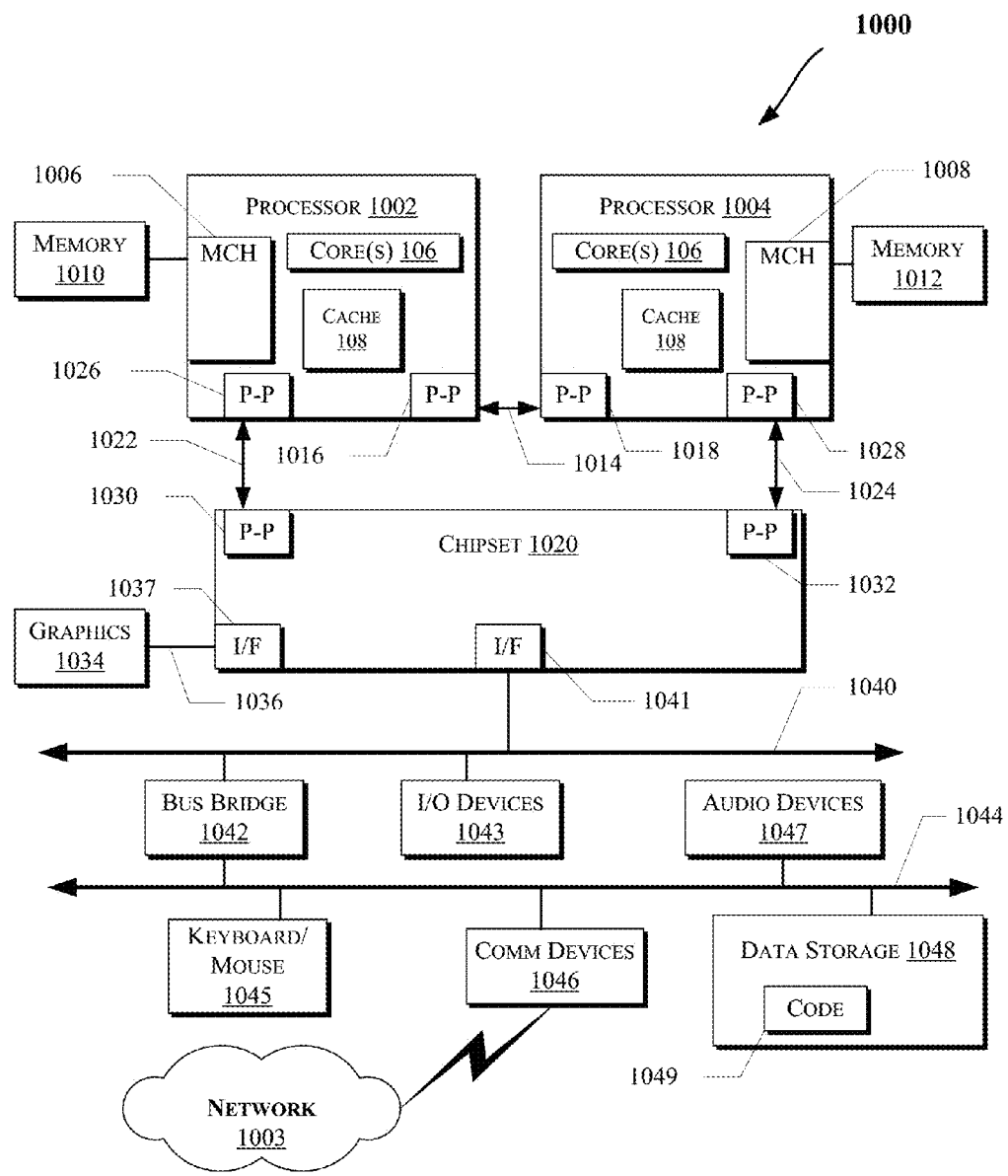

FIG. 10 illustrates a computing system 1000 that is arranged in a point-to-point (PtP) configuration, according to an example. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012.

In an example, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 1004. Other examples, however, may exist in other circuits, logic units, or devices within the system 1000 of FIG. 10. Furthermore, other examples may be distributed throughout several circuits, logic units, or devices illustrated in FIG. 10.

The chipset 1020 may communicate with a bus 1040 using a PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 1003), audio I/O device, and/or a data storage device 1048. The data storage device 1048 (which may be a hard disk drive or a NAND flash based solid state drive) may store code 1049 that may be executed by the processors 1004.

The following pertains to further examples.

Example 1 is a chassis for an electronic device comprising a unitary body comprising a first major surface and a second major surface, a first wall and a second wall defining a chamber having a first opening to receive an electronic component.

In Example 2, the subject matter of Example 1 can optionally include an arrangement in which the first major surface comprises a keyboard emboss dimensioned to receive a keyboard tray.

In Example 3, the subject matter of any one of Examples 1-2 can optionally include an arrangement in which the first major surface comprises a trackpad emboss dimensioned to receive a trackpad cover.

In Example 4, the subject matter of any one of Examples 1-3 can optionally include a first end cap dimensioned to fit over the first opening In Example 5, the subject matter of any one of Examples 1-4 can optionally include an arrangement in which the the first end cap comprises an input/output (I/O) port to be coupled to the electronic component.

In Example 6, the subject matter of any one of Examples 1-5 can optionally include a second end cap dimensioned to fit over a second opening of the chamber.

In Example 7, the subject matter of any one of Examples 1-6 can optionally include an arrangement in which the the second end cap comprises an input/output (I/O) port to be coupled to the electronic component.

In Example 8, the subject matter of any one of Examples 1-7 can optionally include an arrangement in which at least one of the first wall or the second wall comprises an input/output (I/O) port to be coupled to the electronic component.

In Example 9, the subject matter of any one of Examples 1-8 can optionally include an arrangement in which the unitary body is formed from a ductile metal by a hydroforming process in which the unitary body is placed into a mold defining one or more negative volumes and sealed and the chamber is pressurized to expand the unitary body.

In Example 10 subject matter of any one of Examples 1-9 can optionally include an arrangement in which portions of the unitary body are removed by a machining process after the hydroforming process In Example 11, the subject matter of Example 10 can optionally include an arrangement in which the.

Example 11 is an electronic device comprising at least one electronic component and a chassis comprising a unitary body comprising a first major surface and a second major surface, a first wall and a second wall defining a chamber having a first opening to receive an electronic component.

In Example 12, the subject matter of Example 11 can optionally include an arrangement in which the first major surface comprises a keyboard emboss dimensioned to receive a keyboard tray.

In Example 13, the subject matter of any one of Examples 11-12 can optionally include an arrangement in which the first major surface comprises a trackpad emboss dimensioned to receive a trackpad cover.

In Example 14, the subject matter of any one of Examples 10-13 can optionally include a first end cap dimensioned to fit over the first opening In Example 15, the subject matter of any one of Examples 10-14 can optionally include an arrangement in which the first end cap comprises an input/output (I/O) port to be coupled to the electronic component.

In Example 16, the subject matter of any one of Examples 10-15 can optionally include a second end cap dimensioned to fit over a second opening of the chamber.

In Example 17, the subject matter of any one of Examples 10-16 can optionally include an arrangement in which the the second end cap comprises an input/output (I/O) port to be coupled to the electronic component.

In Example 18, the subject matter of any one of Examples 10-17 can optionally include a at least one of the first wall or the second wall comprises an input/output (I/O) port to be coupled to the electronic component.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and examples are not limited in this respect.

The terms "computer readable medium" as referred to herein relates to media capable of maintaining expressions which are perceivable by one or more machines For example, a computer readable medium may comprise one or more storage devices for storing computer readable instructions or data. Such storage devices may comprise storage media such as, for example, optical, magnetic or semiconductor storage media. However, this is merely an example of a computer readable medium and examples are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and examples are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular examples, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one example" or "some examples" means that a particular feature, structure, or characteristic described in connection with the example is included in at least an implementation. The appearances of the phrase "in one example" in various places in the specification may or may not be all referring to the same example.

Although examples have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A chassis for an electronic device, comprising:
   a unitary body comprising a first major surface and a second major surface, a first wall and a second wall defining a chamber having a first opening to receive an electronic component, wherein the first major surface comprises a keyboard emboss dimensioned to receive a keyboard tray and a trackpad emboss dimensioned to receive a trackpad cover; and
   at least one jacking flange comprising an inclined surface which, when inserted into the chamber, urges the electronic component toward the first major surface such that a keyboard is urged into the keyboard tray and a trackpad is urged into position under the trackpad cover.

2. The chassis of claim 1, further comprising:
   a first end cap dimensioned to fit over the first opening.

3. The chassis of claim 2, wherein:
   the first end cap comprises an input/output (I/O) port to be coupled to the electronic component.

4. The chassis of claim 1, further comprising:
   a second end cap dimensioned to fit over a second opening of the chamber.

5. The chassis of claim 4, wherein:
   the second end cap comprises an input/output (I/O) port to be coupled to the electronic component.

6. The chassis of claim 1, wherein:
   at least one of the first wall or the second wall comprises an input/output (I/O) port to be coupled to the electronic component.

7. The chassis of claim 1, wherein the unitary body is formed from a ductile metal by a hydroforming process in which the unitary body is placed into a mold defining one or more negative volumes and sealed and the chamber is pressurized to expand the unitary body.

8. The chassis of claim 7, wherein:
   portions of the unitary body are removed by a machining process after the hydroforming process.

9. An electronic device, comprising:
   at least one electronic component; and
   a chassis comprising a unitary body comprising a first major surface and a second major surface, a first wall and a second wall defining a chamber having a first opening to receive an electronic component, wherein the first major surface comprises a keyboard emboss dimensioned to receive a keyboard tray and a trackpad emboss dimensioned to receive a trackpad cover; and
   at least one jacking flange comprising an inclined surface which, when inserted into the chamber, urges the electronic component toward the first major surface such that a keyboard is urged into the keyboard tray and a trackpad is urged into position under the trackpad cover.

10. The electronic device of claim 9, further comprising:
    a first end cap dimensioned to fit over the first opening.

11. The electronic device of claim 10, wherein:
    the first end cap comprises an input/output (I/O) port to be coupled to the electronic component.

12. The electronic device of claim 9, further comprising:
    a second end cap dimensioned to fit over the first opening.

13. The electronic device of claim 12, wherein:
    the second end cap comprises an input/output (I/O) port to be coupled to the electronic component.

14. The electronic device of claim 9, wherein:
    at least one of the first wall or the second wall comprises an input/output (I/O) port to be coupled to the electronic component.

15. The electronic device of claim 9, wherein the unitary body is formed from a ductile metal by a hydroforming process in which the unitary body is placed into a mold defining one or more negative volumes and sealed and the chamber is pressurized to expand the unitary body.

16. The electronic device of claim 15, wherein:
    portions of the unitary body are removed by a machining process after the hydroforming process.

* * * * *